United States Patent
Qin et al.

(10) Patent No.: US 10,978,526 B2
(45) Date of Patent: Apr. 13, 2021

(54) DISPLAY DEVICE, DISPLAY PANEL AND METHOD OF FABRICATING THE SAME

(71) Applicant: BOE TECHNOLOGY GROUP CO., LTD., Beijing (CN)

(72) Inventors: Chengjie Qin, Beijing (CN); Dejun Bu, Beijing (CN); Song Zhang, Beijing (CN); Tao Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/535,669

(22) Filed: Aug. 8, 2019

(65) Prior Publication Data

US 2020/0295102 A1 Sep. 17, 2020

(30) Foreign Application Priority Data

Mar. 13, 2019 (CN) .......................... 201910189407.6

(51) Int. Cl.
    *H01L 27/32* (2006.01)
    *H01L 51/56* (2006.01)
    *H01L 51/52* (2006.01)

(52) U.S. Cl.
    CPC ...... *H01L 27/3246* (2013.01); *H01L 51/5253* (2013.01); *H01L 51/56* (2013.01)

(58) Field of Classification Search
    None
    See application file for complete search history.

(56) References Cited

U.S. PATENT DOCUMENTS

| 8,111,220 B2* | 2/2012 | Asano ................. H01L 51/5253 345/76 |
| 10,205,122 B2* | 2/2019 | Choi .................... H01L 51/0096 |
| 10,615,369 B2* | 4/2020 | Choi .................... H01L 51/0097 |
| 2010/0259715 A1* | 10/2010 | Tanaka ................ H01L 27/1244 349/143 |

(Continued)

FOREIGN PATENT DOCUMENTS

| CN | 106409867 | 2/2017 |
| CN | 106469746 | 3/2017 |

(Continued)

OTHER PUBLICATIONS

1st Office Action dated Jun. 22, 2020 for Chinese Patent Application No. 201910189407.6.

*Primary Examiner* — Evren Seven
(74) *Attorney, Agent, or Firm* — Thomas Horstemeyer, LLP

(57) ABSTRACT

The present disclosure provides a display device, a display panel, and a fabricating method, and generally relates to the field of display technology. The display panel of the present disclosure comprises a substrate, a drive layer, a separation layer, a display device layer, and a through hole. The substrate has an opening zone, a transition zone surrounding the opening zone, and a display area surrounding the transition zone. The drive layer is disposed on a side of the substrate and covering the opening zone, the transition zone, and the display area. The separation layer is disposed on a surface of the drive layer away from the substrate and is located in the transition zone. The display panel of the present disclosure can prevent water and oxygen from entering the display area to prevent erosion of the display device.

11 Claims, 7 Drawing Sheets

(56) References Cited

U.S. PATENT DOCUMENTS

| | | | |
|---|---|---|---|
| 2017/0031323 A1* | 2/2017 | Kim | H01L 27/3258 |
| 2017/0150618 A1* | 5/2017 | Choi | H02J 50/10 |
| 2017/0237038 A1* | 8/2017 | Kim | H01L 51/5253 |
| | | | 257/40 |
| 2017/0288004 A1* | 10/2017 | Kim | H01L 27/3276 |
| 2020/0295102 A1* | 9/2020 | Qin | H01L 51/56 |

FOREIGN PATENT DOCUMENTS

| | | |
|---|---|---|
| CN | 107452894 | 12/2017 |
| CN | 108428802 | 8/2018 |

* cited by examiner

DISPLAY DEVICE, DISPLAY PANEL AND METHOD OF FABRICATING THE SAME

CROSS-REFERENCE TO RELATED APPLICATIONS

This application is based upon and claims priority to Chinese Patent Application No. 201910189407.6, filed on Mar. 13, 2019, the entire contents thereof are incorporated herein by reference.

TECHNICAL FIELD

The present disclosure relates to a field of display technology and, in particular, to a display device, a display panel and a fabricating method thereof.

BACKGROUND

Currently, for mobile phones, computers, and other devices, it is often needed to open a hole on a display panel so as to set a device, such as a camera, a sensor or the like, in order to reduce the width of the edge of the display panel, thereby achieving a narrow frame and even a frameless design. However, for OLED (Organic Light Emitting Diode) display panels, due to the presence of the openings, water and oxygen in the air may penetrate along the organic light-emitting layer toward the display area thus, eroding the display device and affecting the display appearance.

It should be noted that the information disclosed in the background section above is only for enhancement of understanding of the background of the present disclosure and thus, may include information that does not constitute prior art known to those of ordinary skill in the art.

SUMMARY

An object of the present disclosure is to provide a display device, a display panel, and a fabricating method thereof, which can prevent water and oxygen from entering the display area to prevent erosion of the display device.

According to an aspect of the present disclosure, a display panel is provided, including:

a substrate having an opening zone, a transition zone surrounding the opening zone, and a display area surrounding the transition zone;

a drive layer disposed on a side of the substrate, and covering the opening zone, the transition zone, and the display area;

a separation layer disposed on a surface of the drive layer away from the substrate and located in the transition zone, wherein the separation layer is disposed around the opening zone and has a separation groove surrounding the opening zone, wherein the separation groove gradually expands toward the substrate;

a display device layer covering the drive layer and the separation layer, wherein the display device layer includes a light-emitting layer, and the light-emitting layer covers the separation layer and is disconnected at the separation groove;

a through hole penetrating through the drive layer and the display device layer and located in the opening zone.

In an exemplary embodiment of the present disclosure, the separation layer is a continuous annular structure, and the separation groove is a continuous annular groove.

In an exemplary embodiment of the present disclosure, the separation layer has a plurality of separation grooves, and the plurality of separation grooves are disposed concentrically around the through hole.

In an exemplary embodiment of the present disclosure, an angle between a sidewall of the separation groove and a bottom surface of the separation groove is not greater than 70°.

In an exemplary embodiment of the present disclosure, the separation groove extends through the separation layer in a direction perpendicular to the substrate.

In an exemplary embodiment of the present disclosure, the drive layer includes:

a switching device layer disposed on the substrate and covering the opening zone, the transition zone, and the display area;

an insulating layer covering the switching device layer;

a passivation layer covering the insulating layer, wherein the separation layer disposed on a surface of the passivation layer away from the substrate.

In an exemplary embodiment of the present disclosure, the display device layer includes:

a flat layer disposed on a surface of the drive layer away from the substrate and located in the display area;

a first electrode disposed on a surface of the flat layer away from the substrate;

a pixel defining layer covering the flat layer and a partial area of the surface of the drive layer away from the substrate, wherein the pixel defining layer has a pixel region in which the first electrode is exposed, and the light-emitting layer covers the pixel defining layer, the first electrode and the separation layer;

a second electrode covering the light-emitting layer and the separation layer, and the second electrode being disconnected at the separation groove.

In an exemplary embodiment of the present disclosure, the display panel further includes:

an encapsulation layer covering the display device layer and extending into separation groove, and an area of the encapsulation layer extending into the separation groove being connected with an area of the encapsulation layer not extending into the separation groove, wherein the through hole extends through the encapsulation layer.

In an exemplary embodiment of the present disclosure, the encapsulation layer includes:

a first inorganic layer covering the display device layer and extending into the separation groove, and an area of the first inorganic layer extending into the separation groove being connected with an area of the first inorganic layer not extending into the separation groove;

an organic layer disposed on a surface of the first inorganic layer away from the substrate, and located in the display area;

a second inorganic layer covering the organic layer and the first inorganic layer and extending into the separation groove, and an area of the second inorganic layer extending into the separation groove being connected with an area of the second inorganic layer not extending into the separation groove, wherein the second inorganic layer and the first inorganic layer are stacked in the separation groove;

wherein the through hole penetrates through the first inorganic layer and the second inorganic layer.

According to an aspect of the present disclosure, a fabricating method for a display panel is provided, including:

providing a substrate, the substrate having an opening zone, a transition zone surrounding the opening zone, and a display area surrounding the transition zone;

forming a drive layer on a side of the substrate, the drive layer covering the opening zone, the transition zone, and the display area;

forming a separation layer on a surface of the drive layer away from the substrate, the separation layer being located in the transition zone and being disposed around the opening zone, and having a separation groove surrounding the opening zone, the separation groove gradually expanding toward the substrate;

forming a display device layer covering the drive layer and the separation layer, the display device layer including a light-emitting layer, and the light-emitting layer covering the separation layer and disconnected at the separation groove;

forming a through hole penetrating through the drive layer and the display device layer, wherein the through hole is located in the opening zone.

In an exemplary embodiment of the present disclosure, forming the drive layer on the side of the substrate, the drive layer covering the opening zone, the transition zone and the display area includes:

forming a switching device layer on the substrate, wherein the switching device layer covers the opening zone, the transition zone, and the display area;

forming an insulating layer covering the switching device layer; and forming a passivation layer covering the insulating layer.

In an exemplary embodiment of the present disclosure, forming the separation layer on the surface of the drive layer away from the substrate, the separation layer being located in the transition zone and being disposed around the opening zone and having a separation groove surrounding the opening zone, the separation groove gradually expanding toward the substrate includes:

forming an auxiliary layer on a surface of the drive layer away from the substrate, the auxiliary layer being located in the transition zone and disposed around the opening zone, and the auxiliary layer having an auxiliary groove surrounding the opening zone, the auxiliary groove gradually shrinking toward the substrate;

forming a separation material layer covering the auxiliary layer, the separation material layer filling the auxiliary groove;

thinning the separation material layer until the auxiliary layer is exposed; and removing the auxiliary layer to obtain the separation layer.

In an exemplary embodiment of the present disclosure, the auxiliary layer is a continuous annular structure, and the auxiliary groove is a continuous annular groove.

In an exemplary embodiment of the present disclosure, the auxiliary layer has a plurality of auxiliary grooves, and the plurality of auxiliary grooves are disposed concentrically around the opening zone.

In an exemplary embodiment of the present disclosure, forming the display device layer covering the drive layer and the separation layer, the display device layer including the light-emitting layer, and the light-emitting layer covering the separation layer and disconnected at the separation groove includes:

forming a flat layer on a surface of the drive layer away from the substrate, wherein the flat layer is located in the display area;

forming a first electrode on a surface of the flat layer away from the substrate;

forming a pixel defining layer covering the flat layer, wherein the pixel defining layer has a pixel region in which the first electrode is exposed;

forming the light-emitting layer covering the pixel defining layer, the first electrode, and the separation layer, wherein the light-emitting layer is disconnected at the separation groove; and forming a second electrode covering the light-emitting layer and the separation layer, wherein the second electrode is disconnected at the separation groove.

In an exemplary embodiment of the present disclosure, one of the flat layer and the pixel defining layer and the auxiliary layer are formed by a same patterning process.

According to one aspect of the present disclosure, a display device including a display panel described in any one of the above is provided.

The above general description and the following detailed description are intended to be illustrative and not restrictive.

BRIEF DESCRIPTION OF THE DRAWINGS

Figures herein are incorporated in and constitute a part of this description, illustrate the principles of the embodiment consistent with the present disclosure, and together with the description serve to explain the present disclosure. It is apparent that the drawings in the following description are only some of the embodiments of the present disclosure, and for those skilled in the art, other drawings may be obtained from these figures without paying any creative work.

DETAILED DESCRIPTION

Figure 1:
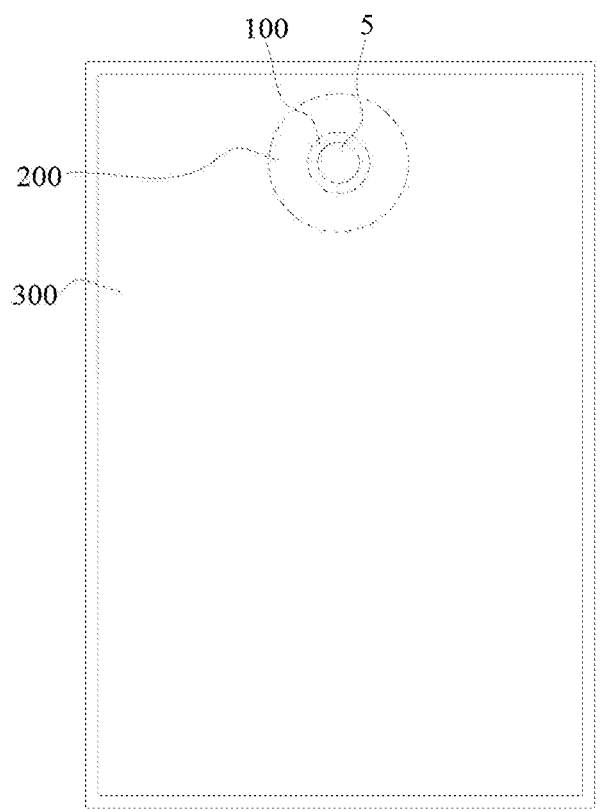
FIG. 1 is a top view of a display panel of an embodiment of the present disclosure.

Example embodiments will now be described more fully with reference to the accompanying drawings. However, exemplary embodiments can be implemented in various forms and should not be construed as limited to the embodiments set forth herein; rather, these embodiments are provided so that this disclosure will be thorough and complete, and the concept of example embodiments will be fully conveyed to those skilled in the art. The same reference numerals in the drawings denote the same or similar structures, and thus, their detailed description will be omitted.

Although the relative terms such as "upper" and "lower" are used in the description to describe the relative relationship of one component illustrated in figures to another component, these terms are used in this description for convenience only. For example, according to a direction of the example described in the accompanying drawings, it will be understood that if the device illustrated in figures is flipped upside down, the "upper" component will become the "lower" component. When a structure is "on" another structure, it may mean that a structure is integrally formed on another structure, or that a structure is "directly" disposed on another structure, or that a structure is "indirectly" disposed through another structure on other structures.

The terms "a", "an", "the", "said" and "at least one" are used to indicate the presence of one or more elements, parts, etc. The terms "including" and "having" are used to mean open inclusive means, and there may be additional elements, components, etc., in addition to the listed elements, components, etc. The terms "first" and "second" are used only as marks without limiting the number of objects.

Figure 2:
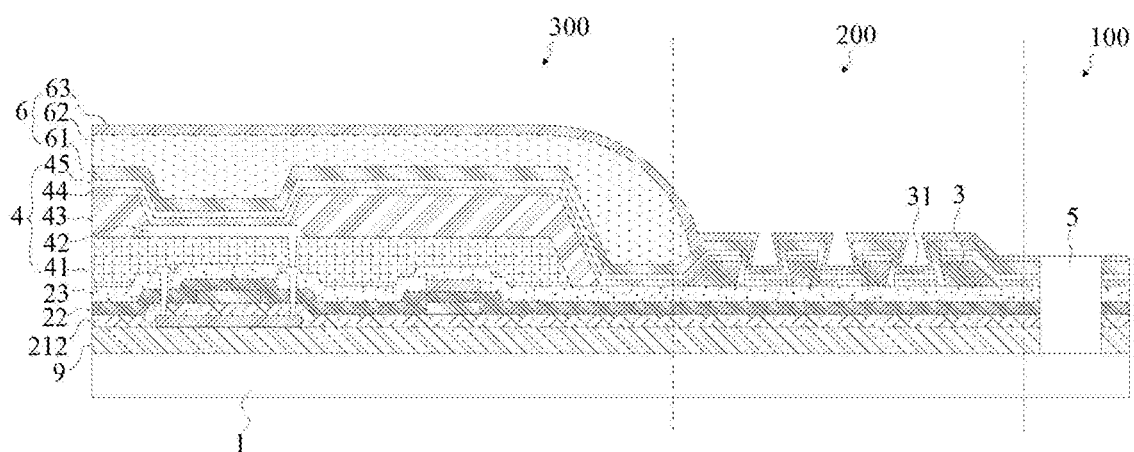
FIG. 2 is a partial sectional view of a display panel of an embodiment of the present disclosure.

Embodiments of the present disclosure provide a display panel, which may be an OLED display panel in some embodiments. As shown in FIGS. 1 and 2, the display panel includes a substrate 1, a drive layer 2, a separation layer 3, a display device layer 4, and a through hole 5, wherein:

The substrate 1 has an opening zone 100, a transition zone 200 surrounding the opening zone 100, and a display area 300 surrounding the transition zone 200. The drive layer 2 is disposed on a side of the substrate 1 and covering the opening zone 100, the transition zone 200, and the display area 300. The separation layer 3 is disposed on a surface of the drive layer 2 away from the substrate 1 and is located in the transition zone 200, wherein the separation layer 3 is disposed around the opening zone 100 and has a separation groove 31 surrounding the opening zone 100, wherein the separation groove 31 gradually expands toward the substrate 1. The display device layer 4 covers the drive layer 2 and the separation layer 3, wherein the display device layer 4 includes a light-emitting layer 44, and the light-emitting layer 44 covers the separation layer 3 and is disconnected at the separation groove 31. The through hole 5 penetrates the drive layer 2 and the display device layer 4, and is located in the opening zone 100.

The display panel according to embodiments of the present disclosure may form the separation layer 3 having the separation groove 31 at the drive layer 2, and the separation groove 31 is gradually expanded toward the substrate 1, such that the opening of the separation groove 31 is smaller than the bottom, thus, the sidewall of the separation groove cannot form the light-emitting layer 44 so that the light-emitting layer 44 is disconnected at the separation groove 31, preventing a path that water and oxygen penetrates to the display area 300, avoiding erosion of the display device, and being beneficial to maintain the display effect.

The various parts of the display panel of the embodiment of the present disclosure are described in detail below:

As shown in FIGS. 1 and 2, the substrate 1 has the opening zone 100, the transition zone 200, and the display area 300, where the opening zone 100 is an area corresponding to the through hole 5, the transition zone 200 is provided surrounding the opening zone 100, and the display area 300 is provided surrounding the transition zone 200, i.e., the transition zone 200 is located between the opening zone 100 and display area 300. Meanwhile, the substrate 1 may be a hard transparent material, such as glass, a flexible transparent material, such as PET (polyethylene terephthalate), or the like. The thickness and shape of the substrate 1 are not particularly limited herein.

Figure 8:
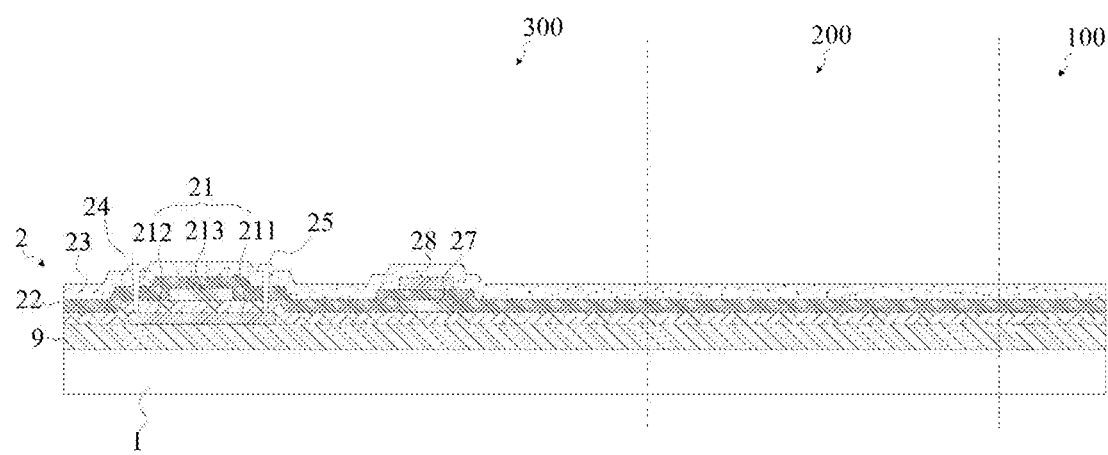
FIG. 8 is a schematic diagram corresponding to step S1220.

The drive layer 2 is provided on one side of the substrate 1 and covers the opening zone 100, the transition zone 200, and the display area 300, i.e., the orthographic projection of the drive layer 2 on the substrate 1 covers the opening zone 100, the transition zone 200, and the display area 300. The drive layer 2 is used for driving the light-emitting layer 44 of the display device layer 4 to emit light to display an image. As shown in FIG. 8, in an embodiment, the drive layer 2 may include a switching device layer 21, an insulating layer 22, and a passivation layer 23, wherein:

The switching device layer 21 is provided on one side of the substrate 1 and covers the opening zone 100, a transition zone 200, and the display area 300. The switching device layer 21 may include a plurality of switching devices distributed in an array, and the switching devices may be a thin film transistor. For example, the switching devices may be a top gate thin film transistor. Correspondingly, the switching device layer 21 may include an active layer 211, a gate insulating layer 212, and a gate 213, wherein the active layer 211 may be provided on one side of the substrate 1, and the active layer 211 may include a source and a drain; and the gate insulating layer 212 covers the active layer 211 and covers the display area 300, transition zone 200, and the gate 213 is disposed on a surface of the gate insulating layer 212 away from the surface of the substrate 1, and is located in the display area 300.

The insulating layer 22 may cover the switching device layer 21, the material of which is a transparent insulating material.

The passivation layer 23 may cover the insulating layer 22, the material of which being a transparent insulating material, and the separation layer 3 may be disposed on a surface of the passivation layer 23 away from the substrate 1.

Further, the surface of the passivation layer 23 away from the substrate 1 may be provided with a source 24 and drain 25. The source 24 is connected to a source portion by a first through hole passing through the insulating layer 22 and the passivation layer 23. The drain 25 is connected to a drain portion by a second through hole passing through the insulating layer 22 and the passivation layer 23. The drive layer 2 may further include a capacitor including a first capacitance plate 27 and a second capacitance plate 28 disposed oppositely. For example, the first capacitance plate 27 may be disposed on a surface of the gate insulating layer 212 away from the substrate 1, and is covered by the insulating layer 22, and the material of the first capacitance plate 27 may be the same as that of the gate 213 so that it may be formed by one patterning process. The second capacitance plate 28 may be disposed on a surface of the insulating layer 22 away from the substrate 1, and is covered by the passivation layer 23. The first capacitance plate 27 faces the second capacitance plates 28, to form a capacitor.

In other embodiments of the present disclosure, the above switching devices may also be a bottom gate thin film transistor.

Figure 12:
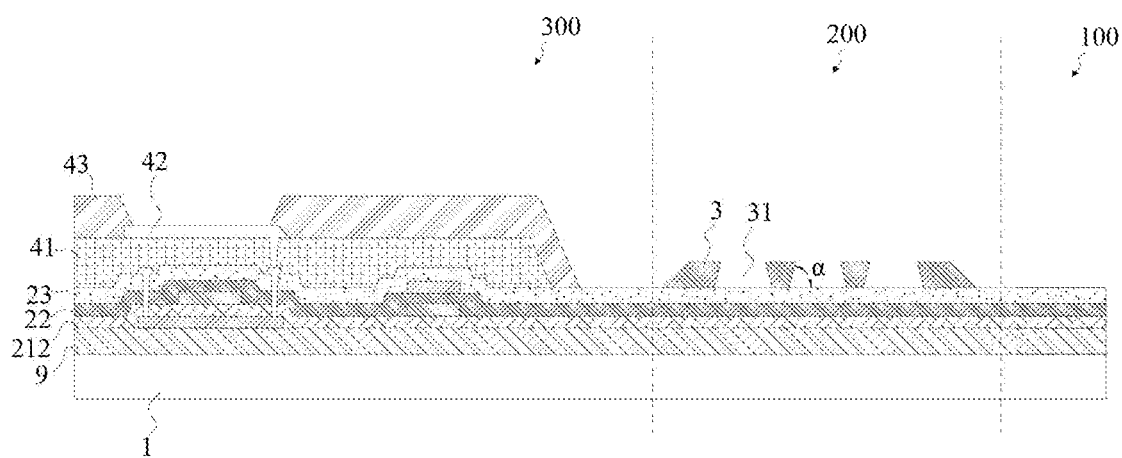
FIG. 12 is a schematic diagram corresponding to step S1340.

As shown in FIGS. 2 and 12, the separation layer 3 may be provided on a surface of the drive layer 2 away from the substrate 1 and is located in the transition zone 200. The separation layer 3 is provided around the opening zone 100, and the material of the separation layer 3 may be oxidation of silicon, nitride of silicon, or other inorganic material. The separation layer 3 has a separation groove 31 surrounding the opening zone 100. The separation groove 31 gradually expands in the direction close to the substrate 1, i.e., gradually contracts in a direction away from the substrate 1, such that the opening of the separation groove 31 is smaller than the bottom of the separation groove 31. For example, a section of the separation groove 31 perpendicular to the substrate 1 is a trapezoid. A small end of the trapezoid is positioned on a side of a big end of the trapezoid away from the substrate 1. When the display device layer 4 is formed on the separation layer 3, the light-emitting layer 44 of the display device layer 4 cannot cover the sidewall of the separation groove 31, thereby allowing the light-emitting layer 44 of the display device layer 4 disconnecting at the separation groove 31, blocking a penetration path from the water-oxygen opening zone 100 to the display area 300 to avoid erosion of the display device layer 4, thereby ensuring display effect.

The separation groove 31 extends through the separation layer 3 in a direction perpendicular to the substrate 1, so that the drive layer 2 is exposed out of the separation groove 31. A bottom of the separation groove 31 is an area on the surface of the drive layer 2 located in the separation groove 31. Understandably, the separation groove 31 may not extend through the separation layer 3 in a direction perpendicular to the substrate 1, so that the drive layer 2 is not exposed out of the separation groove 31.

In order to ensure the separation groove 31 can separate the light-emitting layer 44, as shown in FIG. 12, an angle a of a sidewall of the separation groove 31 and the bottom of the separation groove 31 is not greater than 70°, e.g., 70°, 60°, 50°, 45° or 30°, and so on. The angle a of the sidewall of the separation groove 31 and the bottom of the separation groove 31 is: in a section of the separation groove 31 perpendicular to the substrate 1, an angle of the sidewall, and the bottom of the separation groove 31. Of course, the angle may be greater than 70°, but should ensure that the opening of the separation groove 31 is smaller than the bottom of the separation groove 31 to ensure the effect that the sidewall of the separation groove 31 separates the light-emitting layer 44.

Figure 13:
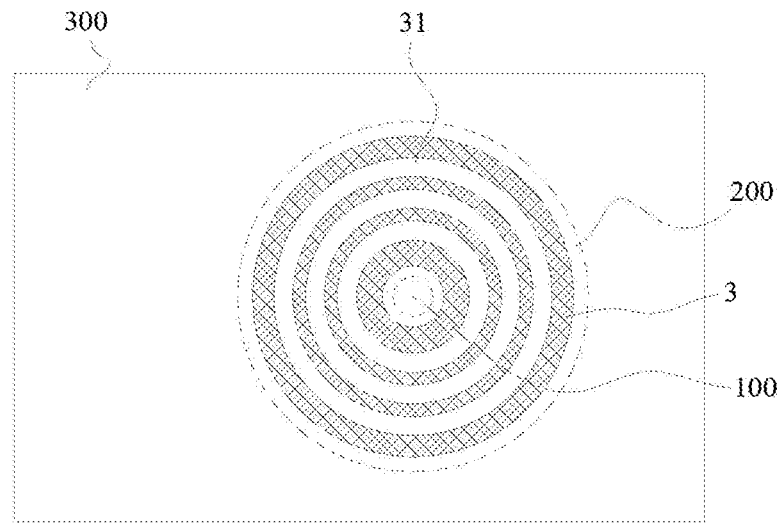
FIG. 13 is a top view of a separation layer corresponding to step S1340.

In an embodiment, as shown in FIG. 13, the separation layer 3 may be a continuous annular structure surrounding the opening zone 100, and the separation groove 31 is a continuous annular groove, so that the light-emitting layer 44 can be disconnected at the separation groove 31 completely, thereby ensuring the blocking of water and oxygen.

Further, there are a plurality of separation grooves 31, for example, two, three, or more, each of the separation grooves 31 having different diameters, and the plurality of separation grooves 31 being provided concentrically about the through hole 5 of the opening zone 100 so as to form a plurality of barriers to block water and oxygen. Of course, the number of the separation groove 31 may also be one.

In another embodiment, the separation groove 31 may also be a discontinuous annular groove. Specifically, the separation groove 31 may include a plurality of trough bodies distributed along a circular trajectory. The adjacent two trough bodies are not connected, and the light-emitting layer 44 is disconnected at the trough bodies of the separation groove 31. That is, the separation groove 31 of the present disclosure can disconnect the light-emitting layer 44, and is not limited to completely disconnect.

As shown in FIG. 2, the display device layer 4 may include the light-emitting layer 44, and the light-emitting layer 44 covers the separation layer 3, and due to the presence of the separation groove 31, the light-emitting layer 44 can be disconnected at the separation groove 31 so as to cut off the path in which water and oxygen intrudes into the display area 300. The display device layer 4 may include a plurality of display devices arranged in an array, and the display devices may be OLED display devices.

In an embodiment, the display device layer 4 may include a flat layer 41, a first electrode 42, a pixel defining layer 43, a light-emitting layer 44, and a second electrode 45, wherein:

The flat layer 41 may be provided on a surface of the drive layer 2 away from the substrate 1 and located in the display area 300, and a surface of the flat layer 41 away from the drive layer 2 is a plane.

The first electrode 42 may be provided on a surface of the flat layer 41 away from the substrate 1. There are a plurality of first electrodes 42. The plurality of first electrodes 42 are distributed in an array and are connected to a plurality of switching devices in the drive layer 2 in a one-to-one correspondence. For example, the switching devices in the drive layer 2 are top gate thin film transistors according to the above-described embodiment. Any one of the first electrodes 42 is connected to the drain of corresponding top gate thin film transistor by a through hole penetrating the flat layer 41.

A pixel defining layer 43 may cover the flat layer 41 and a partial area of the surface of the drive layer 2 away from the substrate 1, wherein the pixel defining layer 43 has a pixel region in which the first electrode 42 is exposed. There are a plurality of pixel regions. The plurality of pixel regions are distributed in an array, and each of the pixel regions exposes each of the first electrodes 42 in a one-to-one correspondence.

The light-emitting layer 44 covers the pixel defining layer 43 and the first electrode 42, extends to the transition zone 200, covers the separation layer 3, and is disconnected at the separation groove 31. For example, the light-emitting layer 44 may include a hole injection layer, a hole transport layer, an organic light-emitting layer, an electron transport layer, and an electron injection layer stacked on the first electrode 42, sequentially.

The second electrode 45 may cover the light-emitting layer 44 and the separation layer 3, and the second electrode 45 is disconnected at the separation groove 31. The light-emitting layer 44 may emit light by the first electrode 42 and the second electrode 45. The specific principle of emission is no longer detailed herein. The light-emitting layer 44 of each pixel region may share the second electrode 45.

As shown in FIGS. 1 and 2, the through hole 5 is located in the opening zone 100, which may be a circular shape, but is not limited thereto, and thus, may also be oval or another shape, which is not particularly limited. The shape and size of the through hole 5 may be the same as that of the opening zone 100, or the through hole 5 may be located within the opening zone. At the same time, the through hole 5 can penetrate through the drive layer 2 and the display device layer 4. A camera, a sensor, or other device is disposed in the through hole 5. Of course, the through hole 5 can also penetrate the substrate 1.

As shown in FIG. 2, the display panel of the present disclosure may further include an encapsulation layer 6 covering the display device layer 4 and extending into the separation groove 31, and an area of the encapsulation layer 6 extending into the separation groove 31 is connected with an area of the encapsulation layer 6 not extending into the separation groove 31, wherein the through hole 5 extends through the encapsulation layer 6.

In an embodiment, the encapsulation layer 6 may include a first inorganic layer 61, an organic layer 62, and a second inorganic layer 63, wherein:

A first inorganic layer 61 covers the display device layer 4 and extends into the separation groove 31. Since inorganic material may formed by vapor deposition, etc., such that the separation groove 31 may be formed of an inorganic material on its sidewall, such that an area of the first inorganic layer 61 extending into the separation groove 31 is connected with an area of the first inorganic layer 61 not extending into the separation groove 31, that is, the first inorganic layer 61 may not be disconnected at the separation grooves 31.

The organic layer 62 is disposed on a surface of the first inorganic layer 61 away from the substrate 1 and is located in the display area 300. The organic layer 62 can absorb the stress from deformation of the encapsulation layer 6.

The second inorganic layer 63 covers the organic layer 62 and the first inorganic layer 61, and extends into the separation groove 31. The second inorganic layer 63 is an inorganic material, and can also be prepared by a method such as vapor deposition, such that an area of the second inorganic layer 63 that extends into the separation grooves 31 is connected to an area that not extends into the separation grooves 31 so that the second inorganic layer 63 and the first inorganic layer 61 are stacked in the separation groove 31. Since the first inorganic layer 61 and the second inorganic layer 63 are inorganic material and are stacked, it can increase the binding force of the two, and due to the presence of the separation groove 31, the first inorganic layer 61, and the second inorganic layer 63 are both recessed into the separation groove 31, the encapsulation distance may be lengthened, thereby improving the packaging effect.

Further, for the above-described through hole 5, it may penetrate the first inorganic layer 61 and the second inorganic layer 63.

As shown in FIG. 2, the display panel of an embodiment of the present may further include a buffer layer 9. The buffer layer 9 is provided on the substrate 1 and covers the opening zone 100, the transition zone 200, and the display area 300. The drive layer 2 may be provided on a surface of the buffer layer 9 away from the surface of substrate 1.

Figure 3:
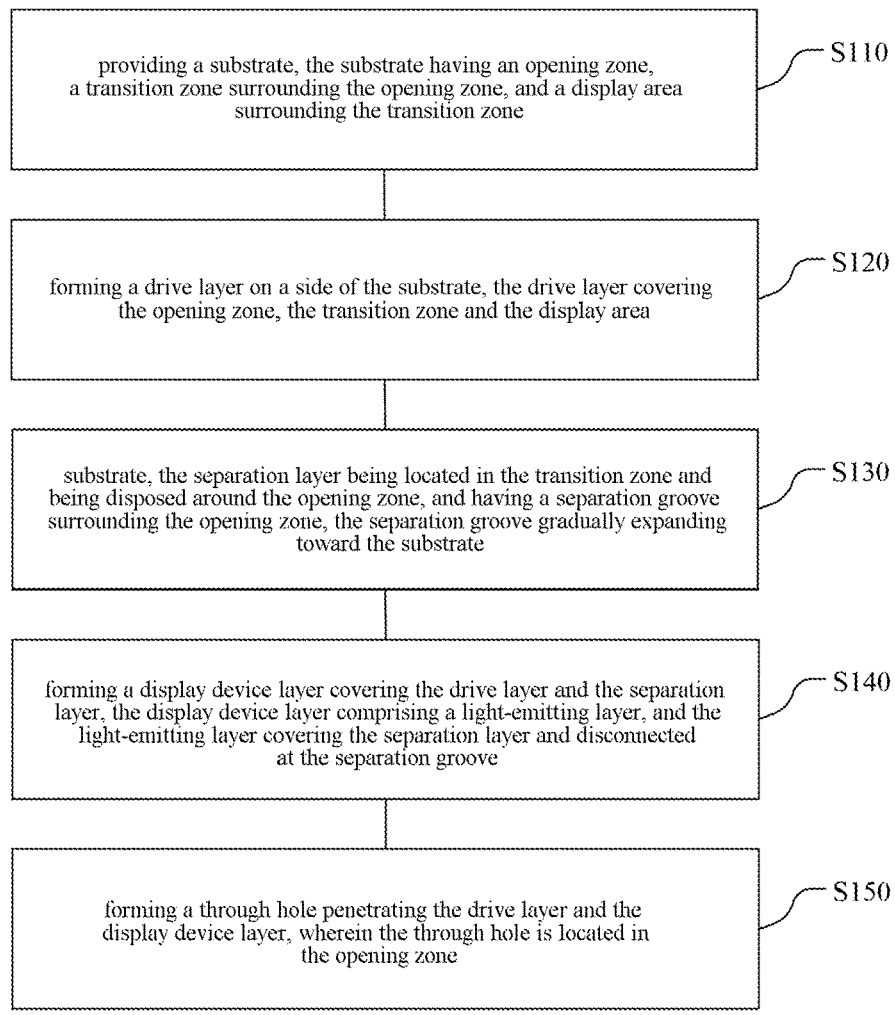
FIG. 3 is a flowchart of a fabricating method of an embodiment of the present disclosure.

The embodiment of the present disclosure further provides a fabricating method for a display panel which may be the display panel in the above embodiment. As shown in FIG. 3, the fabricating method may include:

Step S110, providing a substrate, the substrate having an opening zone, a transition zone surrounding the opening zone, and a display area surrounding the transition zone.

Step S120, forming a drive layer on a side of the substrate, the drive layer covering the opening zone, the transition zone, and the display area.

Step S130, forming a separation layer on a surface of the drive layer away from the substrate, the separation layer being located in the transition zone and being disposed around the opening zone, and having a separation groove surrounding the opening zone, the separation groove gradually expanding toward the substrate 1.

Step S140, forming a display device layer covering the drive layer and the separation layer, the display device layer including a light-emitting layer, and the light-emitting layer covering the separation layer and disconnected at the separation groove.

Step S150, forming a through hole penetrating the drive layer and the display device layer, wherein the through hole is located in the opening zone.

In the fabricating method of the embodiment of the present disclosure, since the separation layer 3 having the separation groove 31 is provided in the drive layer 2, and the separation groove 31 is gradually expanded toward the substrate 1 so the separation groove 31 is an opening smaller than the bottom, the sidewall of the separation groove 31 cannot form the display device layer 4 such that the light-emitting layer 44 may be disconnected at the separation groove 31, preventing a path that water and oxygen from penetrating to the display area 300, avoiding erosion of the display device, and being beneficial to maintain the display effect.

The steps of the fabricating method of the embodiment of the present disclosure are described in detail below:

In step S110, provide a substrate, the substrate having an opening zone, a transition zone surrounding the opening zone, and a display area surrounding the transition zone.

Figure 7:
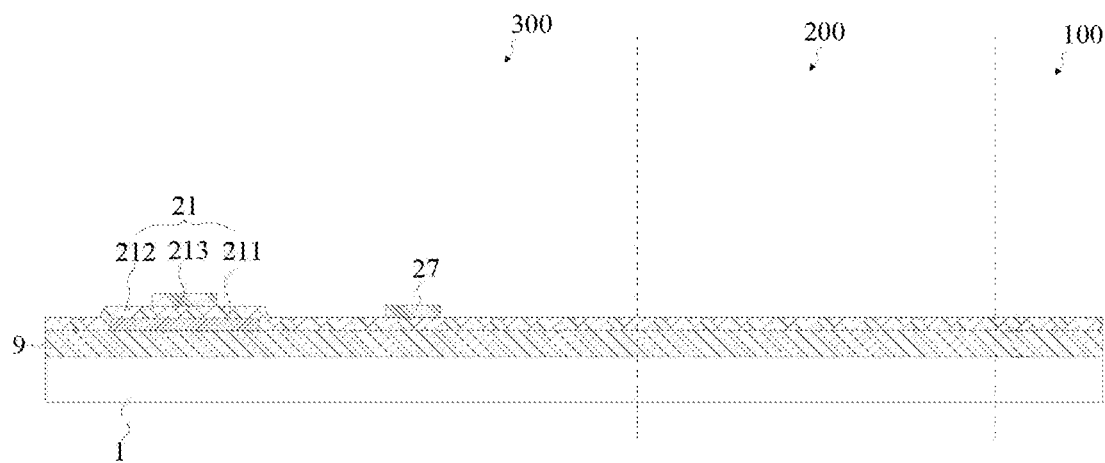
FIG. 7 is a schematic diagram corresponding to step S1210.

As shown in FIG. 7, the substrate 1 has the opening zone 100, the transition zone 200, and the display area 300, wherein the opening zone 100 is an area corresponding to the through hole 5, the transition zone 200 is provided surrounding the opening zone 100, and the display area 300 is provided surrounding the transition zone 200, i.e., the transition zone 200 is located between the opening zone 100 and display area 300. Meanwhile, the substrate 1 may be a hard transparent material, such as glass, a flexible transparent material, such as PET, or the like. The thickness and shape of the substrate 1 are not particularly limited herein.

In step S120, form a drive layer on a side of the substrate, the drive layer covering the opening zone, the transition zone and the display area.

Figure 4:
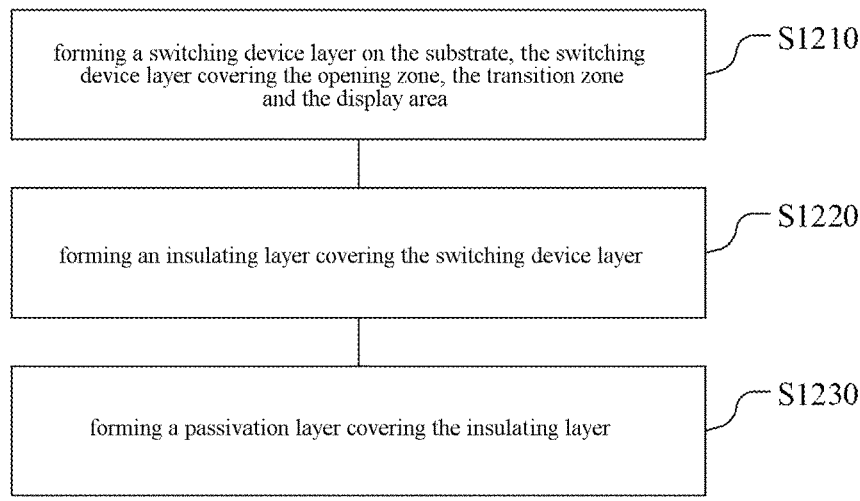
FIG. 4 is a flowchart of step S120 of a fabricating method of an embodiment of the present disclosure.

As shown in FIG. 8, the drive layer 2 is provided on a side of the substrate 1 and covers the opening zone 100, the transition zone 200, and display area 300 for driving the light-emitting layer 44 in the display device layer 4 emitting light to display an image. As shown in FIG. 4, in one embodiment, the drive layer 2 is formed on the substrate 1, i.e., step S120 includes step S1210-step S1230, wherein:

Step S1210, forming a switching device layer on the substrate, the switching device layer covering the opening zone, the transition zone, and the display area.

As shown in FIG. 7, the switching device layer 21 may include a plurality of switching devices distributed in an array, and the switching devices may be thin film transistors. For example, the switching devices may be top gate thin film transistors, correspondingly, forming a switching device layer 21, i.e., the step S1210 may include: forming the active layer 211 on the substrate 1, and the active layer 211 being located in the display area 300, where the active layer 211 may include a source portion and a drain portion; forming a gate insulating layer 212 covering the active layer 211 and covering the transition zone 200 and the display area 300; forming the gate 213 on a surface of the gate insulation layer 212 away from the substrate 1, the gate 213 being located in the display area 300.

Step S1220, forming an insulating layer covering the switching device layer.

As shown in FIG. 8, the material of the insulating layer 22 is a transparent insulating material.

Step S1230, forming a passivation layer covering the insulating layer.

As shown in FIG. 8, the material of the passivation layer 23 is a transparent insulating material, and the separation layer 3 may be disposed on a surface of the passivation layer 23 away from the substrate 1.

Further, after step S1230 and before the step S130, the source 24 and drain 25 are also disposed on the surface of the passivation layer 23 away from the substrate 1, the source 24 is connected to the source portion by penetrating through the first through hole of the passivation layer 23 and the insulating layer 22, and the drain 25 is connected to the drain portion by penetrating through the second through hole of the passivation layer 23 and the insulating layer 22.

The drive layer 2 may further include a capacitor including a first capacitance plate 27 and a second capacitance plate 28 disposed oppositely. For example, the first capacitance plate 27 may be disposed on a surface of the gate insulating layer 212 away from the substrate 1, and being covered by the insulating layer 22, and the material of the first capacitance plate 27 may be the same as the gate 213 so that it can be formed by one patterning process. After step S1220 and step before S1230, the second capacitance plate 28 may be formed on the surface of the insulating layer 22 away from the substrate. The first capacitance plate 27 faces the second capacitance plate 28 to form a capacitor.

Step S130, forming a separation layer on a surface of the drive layer away from the substrate, the separation layer being located in the transition zone and being disposed around the opening zone and having a separation groove surrounding the opening zone, the separation groove gradually expanding toward the substrate.

As shown in FIG. 12, the separation layer 3 may be provided on a surface of the drive layer 2 away from the substrate 1 and is located in the transition zone 200. The separation layer 3 is provided around the opening zone 100, and the material of the separation layer 3 may be oxidation of silicon, nitride of silicon or other inorganic material. The separation layer 3 has a separation groove 31 surrounding the opening zone 100. The separation groove 31 gradually expands in the direction close to the substrate 1, i.e., gradually contracts in a direction away from the substrate 1, such that the opening of the separation groove 31 is smaller than the bottom of the separation groove 31. For example, a section of the separation groove 31 perpendicular to the substrate 1 is a trapezoid. A small end of the trapezoid is positioned on a side of a big end of the trapezoid away from the substrate 1. When the display device layer 4 is formed on the separation layer 3, the light-emitting layer 44 of the display device layer 4 cannot cover the sidewall of the separation groove 31, thereby allowing the light-emitting layer 44 of the display device layer 4 disconnecting at the separation groove 31, blocking a penetration path from the water-oxygen opening zone 100 to the display area 300 to avoid erosion of the display device layer 4, ensuring display effect.

Figure 5:
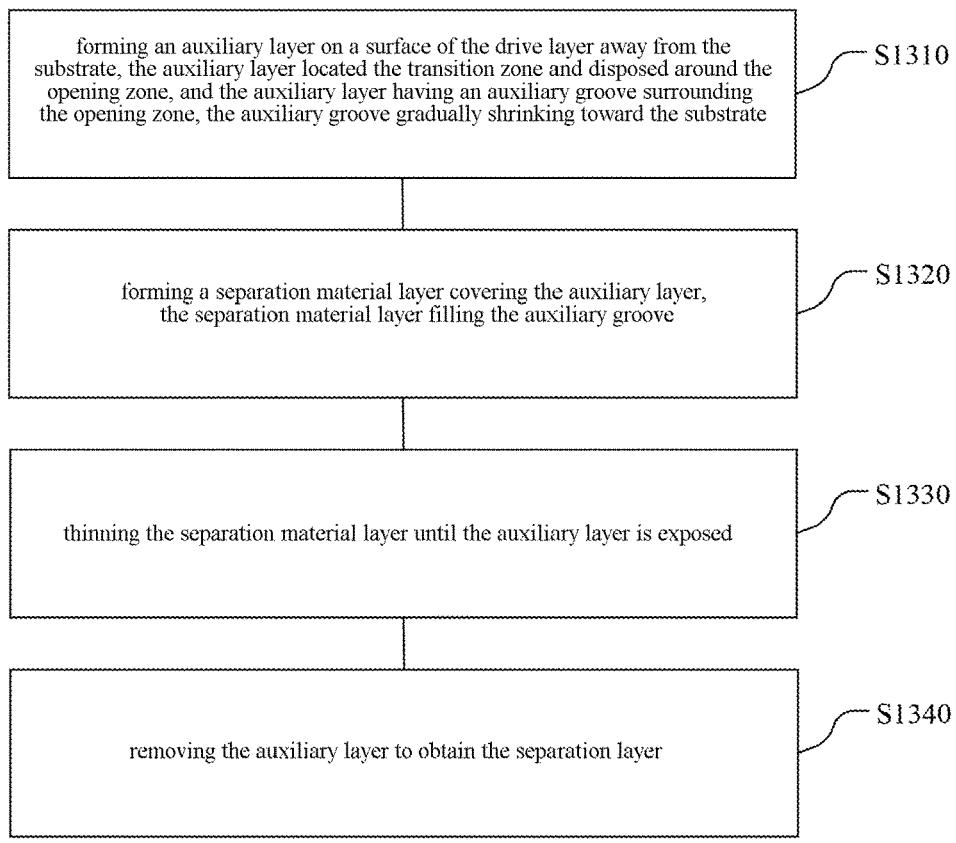
FIG. 5 is a flowchart of step S130 of a fabricating method of an embodiment of the present disclosure.

As shown in FIG. 5, in an embodiment, a separation layer is formed on the surface of the drive layer away from the substrate, that is, step S130 includes step S1310-step S1340, wherein:

Step S1310, forming an auxiliary layer on a surface of the drive layer away from the substrate, the auxiliary layer being located the transition zone and disposed around the opening zone, and the auxiliary layer having an auxiliary groove surrounding the opening zone, the auxiliary groove gradually shrinking toward the substrate.

Figure 9:
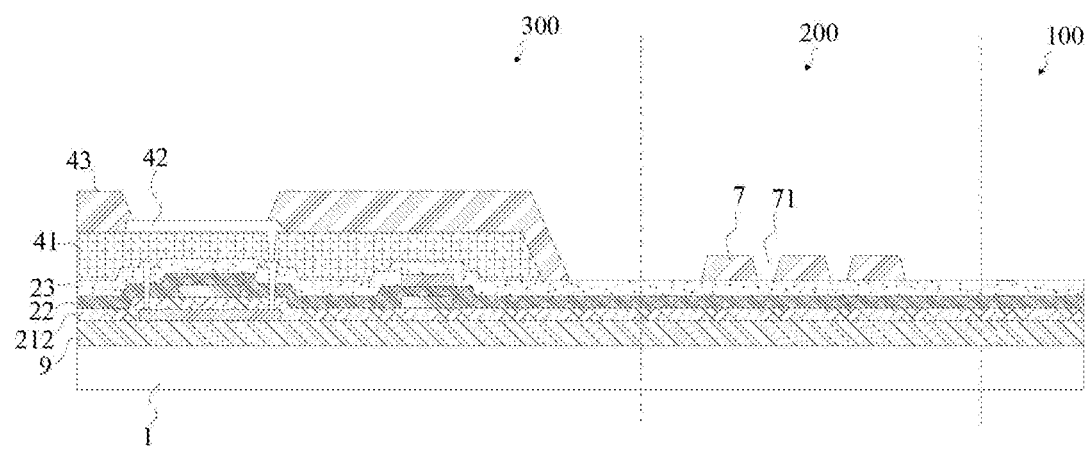
FIG. 9 is a schematic diagram corresponding to step S1310.

As shown in FIG. 9, the auxiliary layer 7 may be an annular configuration and is disposed around the opening zone 100. The material of the auxiliary layer 7 is different from the material of the separation layer 3, and either of these two may be individually removed. For example, the material of the separation layer 3 may be oxidation of silicon, nitride of silicon, or other inorganic material, and the material of the auxiliary layer 7 is an organic material.

The auxiliary layer 7 has an auxiliary groove 71 surrounding the opening zone 100, and the auxiliary groove 71 gradually shrinks toward the substrate 1 so that the opening of the auxiliary groove 71 is larger than its bottom. For example, a section of the auxiliary groove 71 perpendicular to the substrate 1 is an inverted trapezoid, a small end of which is located on drive layer 2. At the same time, the auxiliary layer 7 is a continuous annular structure, and the auxiliary groove 71 is a continuous annular groove to form a continuous separation layer 3 and a continuous separation groove 31. For example, there are a plurality of the auxiliary grooves 71, and the plurality of auxiliary grooves 71 concentrically surround the opening zone 100. Of course, the auxiliary groove 71 may also be a discontinuous annular groove so as to form a discontinuous annular separation groove 31 in the foregoing embodiment.

Step S1320, forming a separation material layer covering the auxiliary layer, the separation material layer filling the auxiliary groove.

Figure 10:
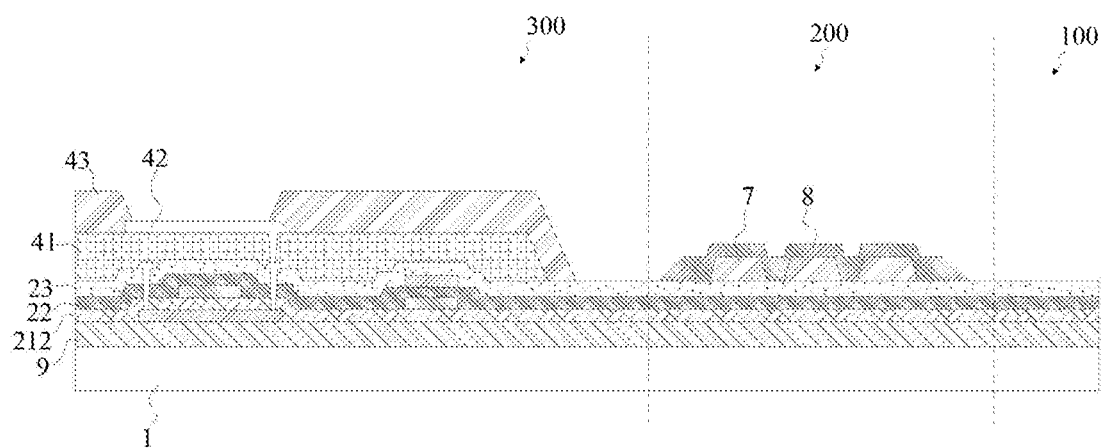
FIG. 10 is a schematic diagram corresponding to step S1320.

As shown in FIG. 10, the separation material layer 8 is located in the transition zone 200, and its material is different from the material of the auxiliary layer 7 and can be removed independently. For example, the auxiliary layer 7 is an organic material, and the separation material layer 8 is an inorganic material. At the same time, the separation material layer 8 completely coats the auxiliary layer 7, that is, the separation material layer 8 covers a surface of the drive layer 2 of the auxiliary layer 7 and a side of the auxiliary layer 7, and fills the auxiliary groove 71.

Step S1330, thinning the separation material layer until the auxiliary layer is exposed.

Figure 11:
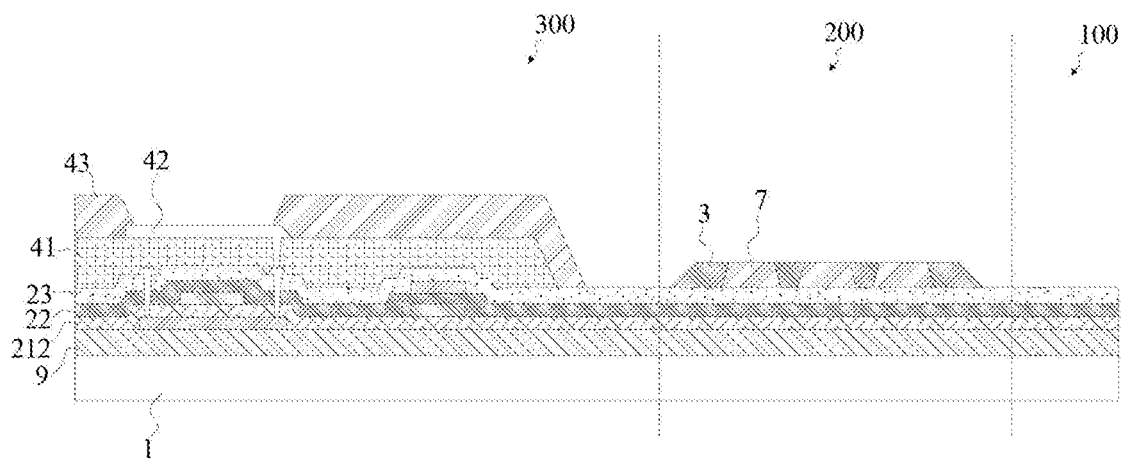
FIG. 11 is a schematic diagram corresponding to step S1330.

As shown in FIG. 11, the separation material layer 8 may be thinned by etching or other process until the auxiliary layer 7 is exposed. The thinned separation material layer 8 no longer covers a surface of the auxiliary layer 7 away from the drive layer 2, but covers a side of the auxiliary layer 7 and fills the auxiliary groove 71.

Step S1340, removing the auxiliary layer to obtain the separation layer.

As shown in FIG. 12, since the auxiliary layer 7 has been exposed from the separation material layer 8, so as to remove the auxiliary layer 7 by etching or other processes and retain the separation material layer 8. The retained separation material layer 8 is the separation layer 3. Specifically, a plurality of portions of the separation material layer 8 filled in the auxiliary groove 71, and a portion of the separation material layer 8 coating a side of the auxiliary layer 7 are retained, i.e., the separation layer 3. After the auxiliary layer 7 is removed, in the plurality of portions filled in the auxiliary groove 71, a groove between two adjacent portions is the separation groove 31. Since the auxiliary groove 71 shrinks toward the substrate 1, two opposing sidewalls of the portions that the separation layer 3 filled into the auxiliary groove 71 shrink toward the substrate 1, while the two opposite sides of the portions coating a side of the auxiliary layer 7 expand toward the substrate 1. The process of removing the auxiliary layer 7 depends on the material of the auxiliary layer 7 and the separation material layer 8 as long as the auxiliary layer 7 is removed while the separation material layer 8 is retained.

An angle a sidewall and a bottom of the auxiliary groove 71 is not less than 110°, such that an angle a between the sidewall of the separation groove 31 and the bottom surface of the separation groove 31 is not greater than 70° obtained after removing the auxiliary layer 7, for example, 70°, 60°, 50°, 45° or 30° and the like, thereby ensuring that the separation groove 31 can break the light-emitting layer 44.

In one embodiment, the auxiliary layer 7 may be a continuous annular structure. The annular structure surrounds the opening zone 100. Correspondingly, the auxiliary groove 71 is a continuous annular groove, such that the formed separation groove 31 may be a continuous annular groove, as shown in FIG. 13, whereby the light-emitting layer 44 is completely disconnected at the separation groove 31 to ensure the effect of blocking water and oxygen.

In addition, there are a plurality of the auxiliary grooves 71, so that the auxiliary layer 7 is completely interrupted in the radial direction into a plurality of independent annular structures, and the portion of the auxiliary layer 7 between the two auxiliary grooves 71 is used to form the separation groove 31. The number of the auxiliary grooves 71 depends on the number of the separation groove 31, but the number of the auxiliary groove 71 is more than the number of the separation groove 31.

In another embodiment, in a plurality of the auxiliary grooves 71 concentrically surrounding the opening zone 100, two adjacent auxiliary grooves 71 can communicate with each other, and the separation material layer 8 in the communication area may be retained, so that separation groove 31 of the separation layer 3 is disconnected, i.e., the separation groove 31 includes a plurality of circular trajectory trough bodies. Adjacent two trough bodies are not communicated. The light-emitting layer 44 is disconnected at the trough bodies of the separation groove 31.

In an embodiment, prior to step S120, the fabricating method of the embodiments of the present disclosure may further include: forming a buffer layer on the substrate, the buffer layer covering the opening zone, the transition zone, and the display area.

As shown in FIG. 7, the buffer layer 9 may be a transparent insulating material, which may cover the opening zone 100, the transition zone 200 and display area 300. Step S130 may be performed after the buffer layer 9 is formed, and the drive layer is formed on the surface of the buffer layer 9 away from the substrate 1. Step S130 may be performed after the buffer layer 9 is formed.

Step S140, forming a display device layer covering the drive layer and the separation layer, the display device layer including a light-emitting layer, and the light-emitting layer covering the separation layer and disconnected at the separation groove.

Figure 14:
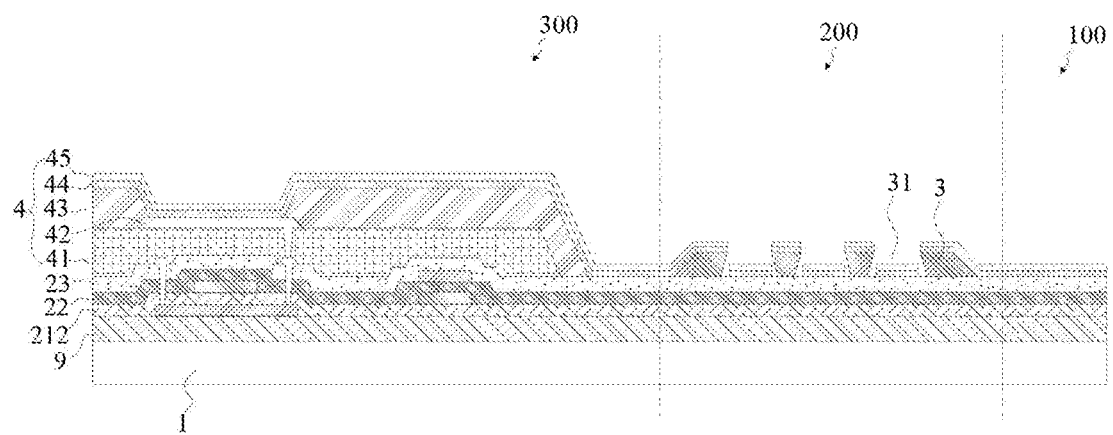
FIG. 14 is a schematic diagram corresponding to the step S140.

As shown in FIG. 14, due to the presence of the separation groove 31, the light-emitting layer 44 can be disconnected at the separation groove 31, so as to cut off the path in which water and oxygen intrudes into the display area 300. The display device layer 4 may include a plurality of display devices arranged in an array, and the display devices may be OLED display devices.

Figure 6:
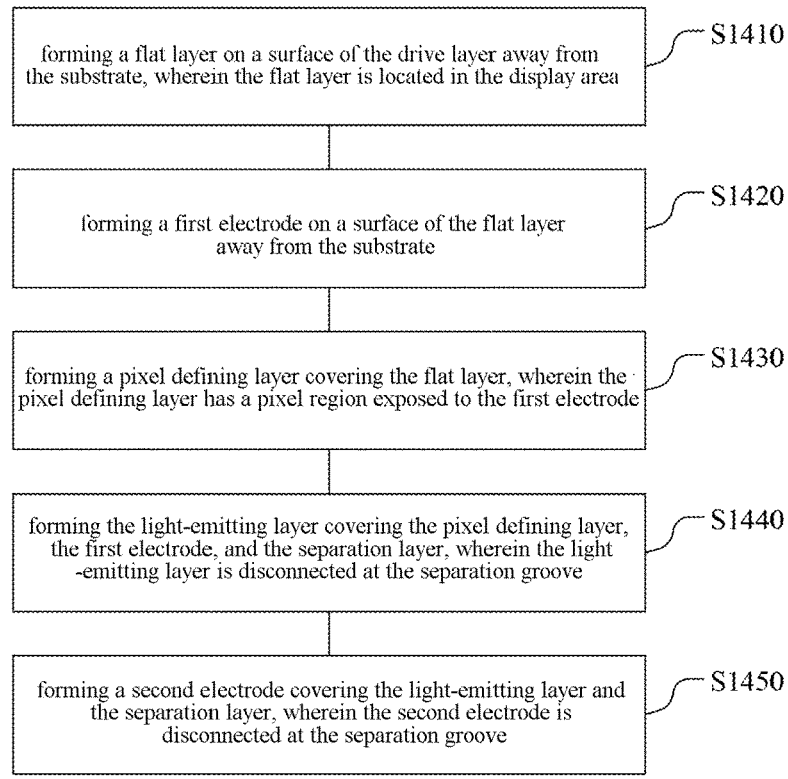
FIG. 6 is a flowchart of step S140 of a fabricating method of an embodiment of the present disclosure.

As shown in FIG. 6, in one embodiment, the display device layer 4 is formed, i.e., step S140 includes steps S1410-step S1450, wherein:

Step S1410, forming a flat layer on a surface of the drive layer away from the substrate, wherein the flat layer is located in the display area.

As shown in FIG. 9, a surface of the flat layer 41 away from the drive layer 2s planar, while if the material of the flat layer 41 and the material of the auxiliary layer 7 are the same, then the flat layer 41 and the auxiliary layer 7 can be formed by one same patterning process. For example, the flat layer 41 and the auxiliary layer 7 may be formed by a mask process on the surface of the passivation layer 23 away from the substrate 1, and the specific steps are not described in detail herein. If the material of the flat layer 41 and the material of the auxiliary layer 7 are different, then they can be formed separately.

Step S1420, forming a first electrode on a surface of the flat layer away from the substrate.

As shown in FIG. 9, a plurality of array-distributed first electrodes 42 may be formed on the surface of the flat layer 41 away from the substrate 1 by a photolithography process. Various first electrodes 42 are connected to a plurality of switching devices in the drive layer 2 in a one-to-one correspondence. For example, the switching devices in the drive layer 2 are top gate thin film transistors according to the above-described embodiment. Any one of the first electrodes 42 is connected to the drain of corresponding top gate thin film transistor by a through hole penetrating the flat layer 41.

Step S1430, forming a pixel defining layer covering the flat layer, wherein the pixel defining layer has a pixel region in which the first electrode is exposed, As shown in 9, the pixel defining layer 43 may cover the flat layer 41 and a partial area of the surface of the drive layer 2 away from the substrate 1, wherein the pixel defining layer 43 has a pixel region in which the first electrode 42 is exposed. There are a plurality of pixel regions. The plurality of pixel regions are distributed in an array, and each of the pixel regions exposes each of the first electrodes 42 in a one-to-one correspondence. If the material of the pixel defining layer 43 and the material of the auxiliary layer 7 are the same, then the pixel defining layer 43 and the auxiliary layer 7 can be formed by one same patterning process. If the material of the pixel defining layer 43 and the material of the auxiliary layer 7 are different, they can be formed separately. If the materials of the pixel defining layer 43, the flat layer 41, and the auxiliary layer 7 are the same, then the auxiliary layer 7 can be formed by one same patterning process with either of the pixel defining layer 43 and the flat layer 41.

Step S1440, forming the light-emitting layer covering the pixel defining layer, the first electrode, and the separation layer, wherein the light-emitting layer is disconnected at the separation groove.

As shown in FIG. 14, the light-emitting layer 44 may be formed by vapor deposition process. For example, the light-emitting layer 44 may include a hole injection layer, a hole transport layer, an organic light-emitting layer, an electron transport layer, and an electron injection layer stacked on the first electrode 42 sequentially. The specific formation process will not be described in detail herein.

Step S1450, forming a second electrode covering the light-emitting layer and the separation layer, wherein the second electrode is disconnected at the separation groove.

As shown in FIG. 14, the second electrode 45 is disconnected at the separation groove 31. The light-emitting layer 44 may emit light by the first electrode 42 and the second electrode 45. The specific principle of emission is no longer detailed herein. The light-emitting layer 44 of each pixel region may share the second electrode 45.

Step S150, forming a through hole penetrating the drive layer and the display device layer, wherein the through hole is located in the opening zone.

As shown in FIG. 2, the process of opening the through hole 5 is not particularly limited herein as long as the display device layer 4 and the drive layer 2 can be penetrated. The through hole 5 is located in the opening zone 100, and its shape may be circular, but is not limited thereto, and thus, also may be oval or another shape, which is not particularly limited. The shape and size of the through hole 5 may be the same as that of the opening zone 100, or the through hole 5 may be located within the opening zone. At the same time, the through hole 5 may penetrate the drive layer 2 and the display device layer 4. A camera, a sensor, or other device is disposed in the through hole 5. Of course, the through hole 5 may also penetrate the substrate 1.

The fabricating method of an embodiment of the present disclosure may further include:

Step S160, forming an encapsulation layer covering the display device layer.

The encapsulation layer 6 may be a single layer or a multiple layer structure. For example, the encapsulation layer 6 includes a first inorganic layer 61, an organic layer 62, and a second inorganic layer 63 sequentially stacked on the display device layer 4. Specifically, step S160 may include step S1610-step S1630, wherein:

Step S1610, forming a first inorganic layer covering the display device layer and extending into the separation groove, and an area of the first inorganic layer extending into the separation groove being connected with an area of the first inorganic layer not extending into the separation groove.

Step S1620, forming an organic layer disposed on a surface of the first inorganic layer away from the substrate and located in the display area.

Step S1630, forming a second inorganic layer covering the organic layer and the first inorganic layer and extending into the separation groove, and an area of the second inorganic layer extending into the separation groove being connected with an area of the second inorganic layer not extending into the separation groove, wherein the second inorganic layer is stacked on the first inorganic layer in the separation groove.

As shown in FIG. 2, details of the first inorganic layer 61, the organic layer 62, and the second inorganic layer 63 have been described in the above embodiment of the display panel, and are not described in detail herein.

It needs to be noted that, in step S150, i.e., the step of opening the through hole 5, may be performed before step S160, such that the encapsulation layer 6 may extend into the through holes 5, and of course, may also be disconnected at the through hole 5. Step S150 may also be performed after step S160, such that the through hole 5 penetrates through the encapsulation layer 6. For example, the through hole 5 penetrates through the first inorganic layer 61 and the second inorganic layer 63.

In addition, although the various steps of the method of the present disclosure are described in a particular order in the drawings, this is not required or implied that the steps must be performed in the specific order, or all the steps shown must be performed to achieve the desired result. Additionally or alternatively, certain steps may be omitted, multiple steps may be combined to execute as one step, and/or one step may be divided into multiple steps for execution.

Embodiments of the present disclosure further provide a display device, and the display device may include the display panel of the above-described embodiment. The configuration of the display panel is omitted herein. The display device may be used in a mobile phone, a tablet computer, or other electronic devices and will not be enumerated herein. In the meantime, the beneficial effects of the display device can be referred to the beneficial effects of the display panel in the above embodiments and will not be described in detail herein.

In the display device, the display panel, and the fabricating method of the display panel of the present disclosure, since the separation layer having the separation groove is provided in the drive layer, and the separation groove is gradually expanded toward the substrate, the sidewall of the separation groove cannot form the light-emitting layer of the display device layer so that the light-emitting layer is disconnected at the separation groove, preventing a path that water and oxygen penetrates from the opening zone to the display area, avoiding erosion of the display device, and being beneficial to maintain the display effect.

Other embodiments of the present disclosure will be apparent to those skilled in the art after considering the description and the practice of the present disclosure disclosed herein. The present application is intended to cover any variations, uses, or adaptations of the present disclosure, which are in accordance with the general principles of the disclosure and include common general knowledge or common technical means in the art that are not disclosed in the present disclosure. The description and examples be considered as exemplary only; the true scope and spirit of the present disclosure are pointed by the appended claims.

What is claimed is:

1. A display panel, comprising:
a substrate having an opening zone, a transition zone surrounding the opening zone, and a display area surrounding the transition zone;
a separation layer located on a side of the substrate and located in the transition zone, wherein the separation layer is disposed around the opening zone and has at least one separation groove surrounding the opening zone, wherein the separation groove gradually expands toward the substrate;
a light-emitting layer located at the display area and the transition zone, wherein the light-emitting layer covers the separation layer and is disconnected at the separation groove, and the separation groove is configured to prevent water and oxygen penetrating from the opening zone to the display area;
a drive layer comprising a switching device layer, an insulating layer covering the switching device layer, and a passivation layer covering the insulating layer, the switching device layer being disposed on the substrate and covering the opening zone, the transition zone, and the display area, the separation layer being disposed on a surface of the passivation layer away from the substrate; and
a through hole penetrating through the light-emitting layer and located in the opening zone.

2. The display panel according to claim 1, wherein the separation layer is a continuous annular structure, and the separation groove is a continuous annular groove.

3. The display panel according to claim 1, wherein the separation layer has a plurality of separation grooves, and the plurality of separation grooves are disposed concentrically around the through hole.

4. The display panel according to claim 1, wherein an angle between a sidewall of the separation groove and a bottom surface of the separation groove is not greater than 70°.

5. The display panel according to claim 1, wherein the separation groove extends through the separation layer in a direction perpendicular to the substrate.

6. The display panel according to claim 1, further comprising a display device layer which comprises:
a flat layer disposed on a surface of a drive layer away from the substrate and located in the display area;
a first electrode disposed on a surface of the flat layer away from the substrate;

a pixel defining layer covering the flat layer and a partial area of the surface of the drive layer away from the substrate, wherein the pixel defining layer has a pixel region in which the first electrode is exposed, and the light-emitting layer covers the pixel defining layer, the first electrode and the separation layer; and a second electrode covering the light-emitting layer and the separation layer, and the second electrode being disconnected at the separation groove.

7. The display panel according to claim 1, wherein the display panel further comprises:

an encapsulation layer covering a display device layer and extending into the separation groove, and an area of the encapsulation layer extending into the separation groove being connected with the area of the encapsulation layer not extending into the separation groove, wherein the through hole extends through the encapsulation layer.

8. The display panel according to claim 7, wherein the encapsulation layer comprises:

a first inorganic layer covering the display device layer and extending into the separation groove, and the area of the first inorganic layer extending into the separation groove being connected with the area of the first inorganic layer not extending into the separation groove;

an organic layer disposed on a surface of the first inorganic layer away from the substrate, and located in the display area; and a second inorganic layer covering the organic layer and the first inorganic layer and extending into the separation groove, and an area of the second inorganic layer extending into the separation groove being connected with an area of the second inorganic layer not extending into the separation groove, wherein the second inorganic layer and the first inorganic layer are stacked in the separation groove;

wherein the through hole penetrates through the first inorganic layer and the second inorganic layer.

9. The display panel according to claim 1, wherein the drive layer disposed on a side of the substrate covering the opening zone, the transition zone, and the display area.

10. The display panel according to claim 1, wherein a section of the separation groove in a direction perpendicular to the substrate has an inverted trapezoid shape.

11. A display device comprising:

a display panel, comprising:

a substrate having an opening zone, a transition zone surrounding the opening zone, and a display area surrounding the transition zone;

a separation layer located on a side of the substrate and located in the transition zone, wherein the separation layer is disposed around the opening zone and has at least one separation groove surrounding the opening zone, wherein the separation groove gradually expands toward the substrate;

a light-emitting layer located at the display area and the transition zone, wherein the light-emitting layer covers the separation layer and is disconnected at the separation groove, and the separation groove is configured to prevent water and oxygen penetrating from the opening zone to the display area;

a drive layer comprising a switching device layer, an insulating layer covering the switching device layer, and a passivation layer covering the insulating layer, the switching device layer disposed on the substrate and covering the opening zone, the transition zone, and the display area, the separation layer being disposed on a surface of the passivation layer away from the substrate; and a through hole penetrating through the light-emitting layer and located in the opening zone.

* * * * *